(12) United States Patent
Zheng et al.

(10) Patent No.: US 11,550,976 B2
(45) Date of Patent: Jan. 10, 2023

(54) NODE FLOW OPTIMIZATION DISTRIBUTION METHOD FOR IMPROVING ACCURACY OF TRANSIENT HYDRAULIC SIMULATION OF WATER SUPPLY IN-SERIES PIPELINE

(71) Applicant: Zhejiang University, Zhejiang (CN)

(72) Inventors: Feifei Zheng, Zhejiang (CN); Yuan Huang, Zhejiang (CN); Qingzhou Zhang, Zhejiang (CN)

(73) Assignee: Zhejiang University, Hangzhou (CN)

( * ) Notice: Subject to any disclaimer, the term of this patent is extended or adjusted under 35 U.S.C. 154(b) by 214 days.

(21) Appl. No.: 16/902,257

(22) Filed: Jun. 15, 2020

(65) Prior Publication Data

US 2021/0019460 A1 Jan. 21, 2021

Related U.S. Application Data

(63) Continuation of application No. PCT/CN2020/072296, filed on Jan. 15, 2020.

(30) Foreign Application Priority Data

Jun. 30, 2019 (CN) .......................... 201910582168.0

(51) Int. Cl.
*G06F 30/28* (2020.01)
*G06Q 50/06* (2012.01)
*E03B 7/02* (2006.01)

(52) U.S. Cl.
CPC ............. *G06F 30/28* (2020.01); *G06Q 50/06* (2013.01); *E03B 7/02* (2013.01)

(58) Field of Classification Search
CPC ............ G06F 30/28; G06Q 50/06; E03B 7/02
See application file for complete search history.

(56) References Cited

U.S. PATENT DOCUMENTS

| | | | |
|---|---|---|---|
| 7,013,248 B1* | 3/2006 | Todini | G05B 15/02 703/2 |
| 8,175,859 B1* | 5/2012 | Wu | G06Q 50/06 703/9 |
| 8,635,051 B1* | 1/2014 | Wu | G06N 3/126 703/9 |
| 9,890,908 B1* | 2/2018 | Esmaili | F17D 1/04 |
| 9,897,259 B1* | 2/2018 | Mancilla | G05D 7/0641 |
| 9,897,260 B1* | 2/2018 | Mancilla | F17D 1/04 |
| 9,915,399 B1* | 3/2018 | Latshaw | G06Q 10/0832 |

* cited by examiner

*Primary Examiner* — Raymond L Nimox

(57) ABSTRACT

The present invention discloses a node flow optimization distribution method for improving the accuracy of transient hydraulic simulation of a water supply in-series pipeline. The present invention optimizes the flow distribution coefficients of intermediate nodes to minimize the impact thereof on the calculation and analysis of transient flow. Further, the simplified error generated by the node flow distribution can be quantified and evaluated by the control threshold of the simplified errors to achieve effective control of the simplified process. In addition, the simplified operation of the method of the present invention is carried out sequentially from the intermediate node with the smallest simplified error, which effectively overcomes the potential defect of the conventional node flow distribution that leads to a significant reduction in the accuracy of the model, and can ensure the reliability and accuracy of the simplified operation of the same-diameter in-series pipeline.

4 Claims, 4 Drawing Sheets

Same-diameter in-series pipeline system

Same-diameter in-series pipeline system

FIG. 1(a)

Node flow distribution of intermediate node $N_2$

An example of a same-diameter in series pipeline system in an example

FIG. 3 (b)

A pipeline network topological structural diagram of a simplified same-diameter in-series pipeline

NODE FLOW OPTIMIZATION DISTRIBUTION METHOD FOR IMPROVING ACCURACY OF TRANSIENT HYDRAULIC SIMULATION OF WATER SUPPLY IN-SERIES PIPELINE

CROSS REFERENCE TO RELATED APPLICATIONS

The present application is a Continuation Application of PCT Application No. PCT/CN2020/072296 filed on Jan. 15, 2020, which claims the benefit of Chinese Patent Application No. 201910582168.0 filed on Jun. 30, 2019. All the above are hereby incorporated by reference.

FIELD OF THE INVENTION

The present invention relates to the field of an urban water supply pipeline network, specifically to a node flow optimization distribution method for improving the accuracy of transient hydraulic simulation of a water supply in-series pipeline.

BACKGROUND OF THE INVENTION

With the development of science and technology and the improvement of the living standards of residents, the informatization and intelligent management of an urban water supply pipeline network have become an inevitable development trend, and are also an important part of China's smart water construction. The establishment and application of a hydraulic model is an indispensable key part of the informatization and intelligence of the pipeline network, and is also an important prerequisite for the monitoring and optimization of the leakage and loss of the water supply pipeline network. In recent years, geographic information system (GIS) has been widely used in the information management of an urban water supply system. GIS has extensive pipeline network topological information and rich component property information, which provide great convenience for the establishment of the hydraulic model of the pipeline network. However, the GIS-based hydraulic model of the water supply pipeline network usually has too detailed and complex system information. With the increasing scale of the water supply pipeline network system, the scale and complexity of the hydraulic model of the pipeline network increases, which makes it more and more difficult to solve and manage the model of the pipeline network. Therefore, appropriate technical measures need to be taken to ensure the universality and ease of use of the model of the pipeline network. The model simplification is a commonly used technical means, which can reduce the complexity of the pipeline network and the number of components to make the model easy to use, while ensuring the simulation accuracy of the model.

The simplification of the in-series pipeline is one of the common operations in the simplification of the water supply network model, which can effectively simplify the number of nodes and pipeline sections in the model. The combination of the same-diameter in-series pipelines is one of the main simplified types and is used to deal with the situation of a large number of user nodes on a single water transmission and distribution pipeline. From the perspective of hydraulic calculation and model application, these scattered user nodes can be combined into a small number of "centralized" user nodes to reduce the complexity of the model. This combination process involves the distribution of flow from the intermediate nodes to the nodes at both ends to maintain the water volume balance of the system. At present, the flow distribution of the conventional intermediate nodes mostly adopts empirical or semi-empirical methods, such as a proportional distribution method or a proportional distribution method according to the length of the in-series pipelines. These conventional methods can ensure that the steady-state hydraulic calculation results before and after the model are simplified are not much different and hence are suitable for application scenarios under steady flow conditions. When a sudden and obvious change in hydraulic state occurs in the pipeline network (i.e., a transient flow state), the conventional method does not take into account the complex effect of the node flow on the transient pressure wave propagation process during the transient flow, so There may be obvious differences between the results of calculation and analysis of the transient flow before and after the flow of the intermediate node is distributed, which leads to unreasonable design of transient prevention and control measures (a function failure or cost waste), thus posing a major hidden danger to the safe operation and management of the pipeline network. From this point of view, at present, the flow distribution of nodes in the simplified process of water supply in-series pipelines lacks a scientific, reasonable and effective method.

SUMMARY

In view of the above situation, in order to overcome the defects of the prior art, the present invention provides a node flow optimization distribution method for improving the accuracy of transient hydraulic simulation of a water supply in-series pipeline, which can ensure that the simplified same-diameter in-series pipeline system will retain the transient hydraulic characteristics of the original system to the maximum extent.

In order to achieve the above objectives, the present invention provides the following technical solutions:

A node flow optimization distribution method for improving the accuracy of transient hydraulic simulation of a water supply in-series pipeline comprises the following steps:

(1) identify same-diameter in-series pipeline systems (IDP) in a pipeline network model to form a collection IDP=$\{IDP_1, IDP_2, \ldots, IDP_N\}$ (N is a natural number) of the same-diameter in-series pipeline systems, wherein N is the number of the same-diameter in-series pipeline systems in the pipeline network model. The same-diameter in-series pipeline systems are the basic objects of simplification of the same-diameter in-series pipelines. For example, the same-diameter in-series pipeline system IDPi comprises four pipelines $P_1, P_2, P_3$, and $P_4$ that are connected in series, three nodes $N_1, N_2$, and $N_3$ that are connected at the middles thereof, and nodes $N_4$ and $N_5$ that are connected at both ends thereof and pipelines $P_5, P_6, P_7$ and $P_8$ that are connected externally. The node flow rates of nodes $N_1, N_2, N_3, N_4$ and $N_5$ are $q_1, q_2, q_3, q_4$ and $q_5$ in sequence; the mathematical expression of the same-pipeline in-series pipeline systems IDPi (i=1, . . . N, N is a natural number) is as follows:

$$IDP_i = \{(P_1, P_2, P_3, P_4), (N_1, N_2, N_3), (N_4, N_5), (P_5, P_6), (P_7, P_8)\} \quad (1);$$

(2) for the same diameter in-series pipeline systems $IDP_i$ (i=1, 2, 3 . . . N) in the set IDP, establish an optimization objective function to calculate the simplified error Err generated by the flow distribution of each intermediate node to form the set $Err_i = \{Err_1, Err_2, \ldots, Err_I\}$ (I Is the number of intermediate nodes);

Taking intermediate nodes $N_1$, $N_2$, and $N_3$ as examples, the established optimization objective functions are as follows respectively:

$$\text{Min: } Err_1 = w_1^1 \left\{ \begin{array}{l} [(\Psi_0^{N_4} - \Psi_d^{N_4})(T_0^{P_5 \to N_4} + T_0^{P_6 \to N_4})]^2 + \\ \{[(1-\Psi_0^{N_2})(1-\Psi_0^{N_1})(1-\Psi_0^{N_4}) - \\ (1-\Psi_d^{N_2})(1-\Psi_d^{N_4})]T_0^{P_1 \to N_4}\}^2 \end{array} \right\} + $$

$$w_1^2 \left\{ \begin{array}{l} (\Psi_0^{N_2} - \Psi_d^{N_2})^2 + \\ \{[(1-\Psi_0^{N_4})(1-\Psi_0^{N_1})(1-\Psi_0^{N_2}) - \\ (1-\Psi_d^{N_4})(1-\Psi_d^{N_2})](T_0^{P_5 \to N_4} + T_0^{P_6 \to N_4})\}^2 \end{array} \right\}; \quad (2)$$

$$\text{Min: } Err_2 = w_2^1 \{(\Psi_0^{N_1} - \Psi_d^{N_1})^2 + \qquad (3)$$
$$[(1-\Psi_0^{N_3})(1-\Psi_0^{N_2})(1-\Psi_0^{N_1}) - (1-\Psi_d^{N_3})(1-\Psi_d^{N_1})]^2\} +$$
$$w_2^2 \{(\Psi_0^{N_3} - \Psi_d^{N_3})^2 +$$
$$[(1-\Psi_0^{N_1})(1-\Psi_0^{N_2})(1-\Psi_0^{N_3}) - (1-\Psi_d^{N_1})(1-\Psi_d^{N_3})]^2\};$$

$$\text{Min: } Err_3 = w_3^1 \left\{ \begin{array}{l} (\Psi_0^{N_2} - \Psi_d^{N_2})^2 + \\ \{[(1-\Psi_0^{N_5})(1-\Psi_0^{N_3})(1-\Psi_0^{N_2}) - \\ (1-\Psi_d^{N_5})(1-\Psi_d^{N_2})](T_0^{P_7 \to N_5} + T_0^{P_8 \to N_5})\}^2 \end{array} \right\} + \quad (4)$$

$$w_3^2 \left\{ \begin{array}{l} [(\Psi_0^{N_5} - \Psi_d^{N_5})(T_0^{P_7 \to N_5} + T_0^{P_8 \to N_5})]^2 + \\ \{[(1-\Psi_0^{N_2})(1-\Psi_0^{N_3})(1-\Psi_0^{N_5}) - \\ (1-\Psi_d^{N_2})(1-\Psi_d^{N_5})]T_0^{P_4 \to N_5}\}^2 \end{array} \right\};$$

In the formula, subscripts 0 and d represent the original same-diameter in-series pipeline systems and the same-diameter in-series pipeline system after the water volume of the intermediate nodes is distributed. $w^1$ and $w^2$ are the weight coefficients. The subscripts 1, 2 and 3 of the weight coefficient correspond to $N_1$, $N_2$ and $N_3$, respectively, which indicate the relative importance of the two simplified in-series pipelines. $\tilde{\Psi}^{N_i}$ is the influence factor of the transient water volume at the node Ni ($i=1,...N$, N is a natural number), which indicates the degree of influence of the water volume at a node $N_i$ on a transient flow process, and the value thereof is between 0-100%. $T^{P_j \to N_i}$ is the propagation coefficient of the connecting pipeline $P_j$ at the node Ni, and the mathematical expression thereof is $T^{P_j \to N_i} = (2A_j/a_j)/\Sigma_{m=1}^{M}(A_m/a_m)$, $A = \pi D^2/4$. $A_j$ is the sectional area of the pipeline. D is the diameter of the pipeline. $a_j$ is the wave velocity of the pipeline. M is the total number of connection pipelines at the node $N_i$, and m is the m-th connection pipeline at the node $N_i$. The value of the propagation coefficient $T^{P_j \to N_i}$ is between 0~2, which means the change degree of the pressure fluctuation amplitude of the transient pressure wave that propagates along the pipeline $P_j$ to the node $N_i$. Specifically, in the formula, $T^{P_5 \to N_4}$ represents the multiples of the transient pressure wave propagating along the pipeline $P_5$ to the node $N_4$ relative to an initial amplitude before reaching a node $N_4$. $T_0^{P_6 \to N_4}$ represents the multiples of the transient pressure wave propagating along the pipeline $P_6$ to the node $N_4$ relative to the initial amplitude before reaching the node $N_4$. The initial steady-state hydraulic state at the node and the properties of the connection pipeline are used to determine the influence factor $\tilde{\Psi}^{N_i}$ of the transient water volume of the node $N_i$, that is, $$\tilde{\Psi}^{N_i} = -1.1 \times 10^{-14} S_{N_i}^4 + 8.9 \times 10^{-11} S_{N_i}^3 - 3.1 \times 10^{-7} S_{N_i}^2 + 6.2 \times 10^{-4} S_{N_i}^4 + 3.8 \times 10^{-3} \quad (5);$$

In the formula, $S_{N_i}$ represents the static property at the node $N_i$, which is determined by the initial steady-state hydraulic state at the node and the properties of the connection pipeline, namely, $S_{N_i} = q_0(N_i)/[gH_0^{0.5}(N_i)\Sigma_{m=1}^{M}(A_m/a_m)]$, where $q_0(N_i)$ and $H_0(N_i)$ represent the initial steady-state water volume and pressure at the node $N_i$, respectively, and g is the acceleration of gravity;

The ratio of the length of the in-series pipelines is used to express the weight coefficient of two in-series pipelines, namely:

$$w_1^1 = L(P_1)/[L(P_1) + L(P_2)] \quad (6);$$

$$w_1^2 = L(P_2)/[L(P_1) + L(P_2)] \quad (7);$$

$$w_2^1 = L(P_2)/[L(P_2) + L(P_3)] \quad (8);$$

$$w_2^2 = L(P_3)/[L(P_2) + L(P_3)] \quad (9);$$

$$w_3^1 = L(P_3)/[L(P_3) + L(P_4)] \quad (10);$$

$$w_3^2 = L(P_4)/[L(P_3) + L(P_4)] \quad (11);$$

In the formula, L represents the length of the pipeline;

Solving the optimization objective function can obtain the simplified error Err and the corresponding optimization decision variable value r; specifically, solving the formulas (2), (3) and (4) can obtain the simplified errors $Err_1$, $Err_2$ and $Err_3$ of the intermediate nodes $N_1$, $N_2$ and $N_3$, and the corresponding optimization decision variable values $r_1$, $r_2$ and $r_3$, respectively;

(3) According to $Err_{min} = \min(Err_i)$, determine the intermediate nodes that are preferably simplified, in order to ensure the accuracy of the simplified model, according to the control threshold $Err_{tol}$ of the simplified error to judge whether the combining operation of the same-diameter in-series pipelines are suitably conducted:

If $Err_{min} \leq Err_{tol}$, it can be simplified. (12);

If $Err_{min} > Err_{tol}$, it is not appropriate to be simplified. (13);

If $Err_{min} \leq Err_{tol}$, it then continues to execute downward; otherwise, jump to Step (6);

(4) Perform simplified operations on intermediate nodes that can be simplified, to determine the flows of simplified nodes at two ends and the parameters of equivalent pipelines;

(5) Remove the simplified intermediate nodes in the same-diameter in-series pipeline systems $IDP_i$; at this time, if the number of intermediate nodes in the IDPi is 0, it means that the in-series pipelines in the current same diameter in-series pipeline systems have all been simplified, then jump to Step (6); otherwise, jump to Step (2) and continue to simplify the current same-diameter in-series pipeline systems;

(6) Complete the simplification of the current same-diameter in-series pipeline systems, start the simplification of the next group of the same-diameter in-series pipeline systems, and return to Step (2) until all the same-diameter in-series pipeline systems have been simplified, which means a simplified process is ended.

In step (2), the value of the optimization decision variable r is between 0 and 1.

In Step (3), the control threshold $Err^{tol}$ ranges from 0.01 to 0.03.

Further, in Step (4), the flow of the simplified nodes at both ends can be determined according to the value of the optimization decision variable r corresponding to $Err_{min}$, for example, the intermediate node $N_2$ is simplified, and the water volumes of the nodes $N_1$ and $N_3$ at two ends are $q_1+r_2q_2$ and $q_3+(1-r_2)q_2$, respectively; the parameters of the equivalent pipelines are determined as follows: (1) the pipeline diameter and wave velocity are equal to the diameter and wave velocity of the in-series pipelines, respectively; (2) the length of the pipelines is equal to the sum of the length of the two in-series pipelines; (3) the resistance coefficient of the pipelines is determined according to the principle of hydraulic equivalence, that is, the head loss of the equivalent pipelines after water flow is simplified is the same as the head loss of the in-series pipelines before the water flow is simplified.

The beneficial effects of the present invention are as follows:

(1) In the simplification of the same-diameter in-series pipeline of the water supply network model, the present invention for the first time proposes a node flow optimization distribution method for improving the accuracy of transient hydraulic simulation of the water supply in-series pipeline. The method of the present invention overcomes the defects of the conventional method that cannot effectively retains the transient hydraulic characteristics of the original system, proposes an optimization model for the flow distribution of intermediate nodes, to minimize the simplification error.

(2) Compared with the conventional empirical or semi-empirical node flow distribution method, the method of the present invention optimizes the flow distribution coefficients of the intermediate nodes to minimize the impact thereof on the calculation and analysis of the transient flow. Further, the simplified error generated by the flow distribution of the nodes can be quantified and evaluated by the control threshold of the simplified error to achieve effective control of the simplified process. In addition, the simplified operation of the method of the present invention is carried out sequentially from the intermediate node with the smallest simplified error, which effectively overcomes the potential defect of the conventional node flow distribution that leads to a significant reduction in the accuracy of the model, and can ensure the reliability and accuracy of simplified operation of the same-diameter in-series pipeline. The present invention can provide important theoretical basis and technical guidance for the prevention and control of the transient flow of the pipeline network.

DETAILED DESCRIPTION

The technical solution of the present invention will be further described in details below in conjunction with the drawings. It should be noted that the specific embodiments are only detailed descriptions of the present invention and should not be considered as limiting the present invention.

Figure 1A:
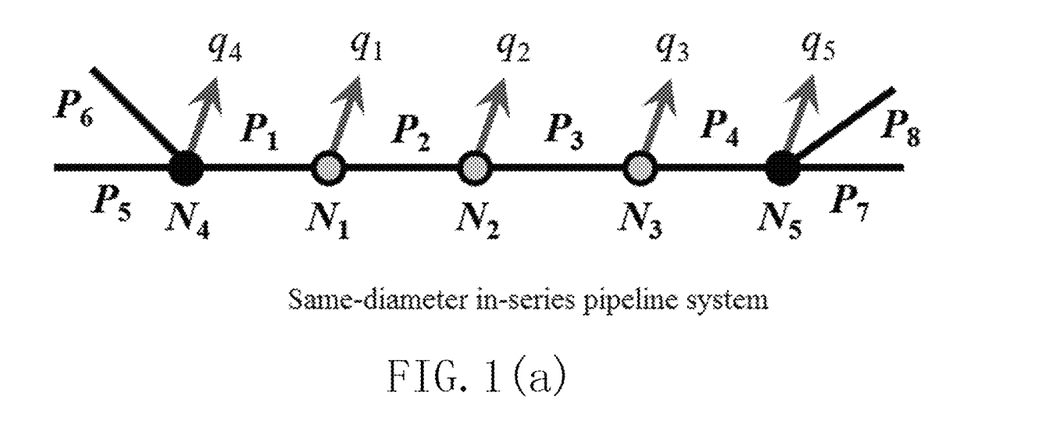
FIG. 1(a)-(b) is a diagram of the flow distribution of same-diameter in-series pipeline systems and nodes.

A node flow optimization distribution method for improving the accuracy of transient hydraulic simulation of a water supply in-series pipeline comprises the following steps:

(1) Identify the same-diameter in-series pipeline systems (IDP) in a pipeline network model to form a collection $IDP=\{IDP_1, IDP_2, \ldots, IDP_N\}$ of the same-diameter in-series pipeline systems, wherein N is the number of the same-diameter in-series pipeline systems in the pipeline network model. The same-diameter in-series pipeline systems are the basic objects of simplification of the same-diameter in-series pipelines proposed by the present invention, and consist of a plurality of pipelines ($P_1, P_2, P_3$, and $P_4$) that are connected in series, a plurality of nodes ($N_1, N_2$, and $N_3$) that are connected at the middles thereof, and nodes ($N_4$ and $N_5$) that are connected at both ends thereof and pipelines ($P_5, P_6, P_7$ and $P_8$) that are connected externally, as shown in FIG. 1(a). The node flow rates of nodes $N_1, N_2, N_3, N_4$ and $N_5$ are $q_1, q_2, q_3, q_4$ and $q_5$ in sequence. The mathematical expression of the same-pipeline in-series pipeline systems IDPi (i=1, ... N) as shown in FIG. 1(a) is as follows:

$$IDP_i=\{(P_1,P_2,P_3,P_4),(N_1,N_2,N_3),(N_4,N_5),(P_5,P_6),(P_7,P_8)\} \quad (1);$$

Figure 1B:
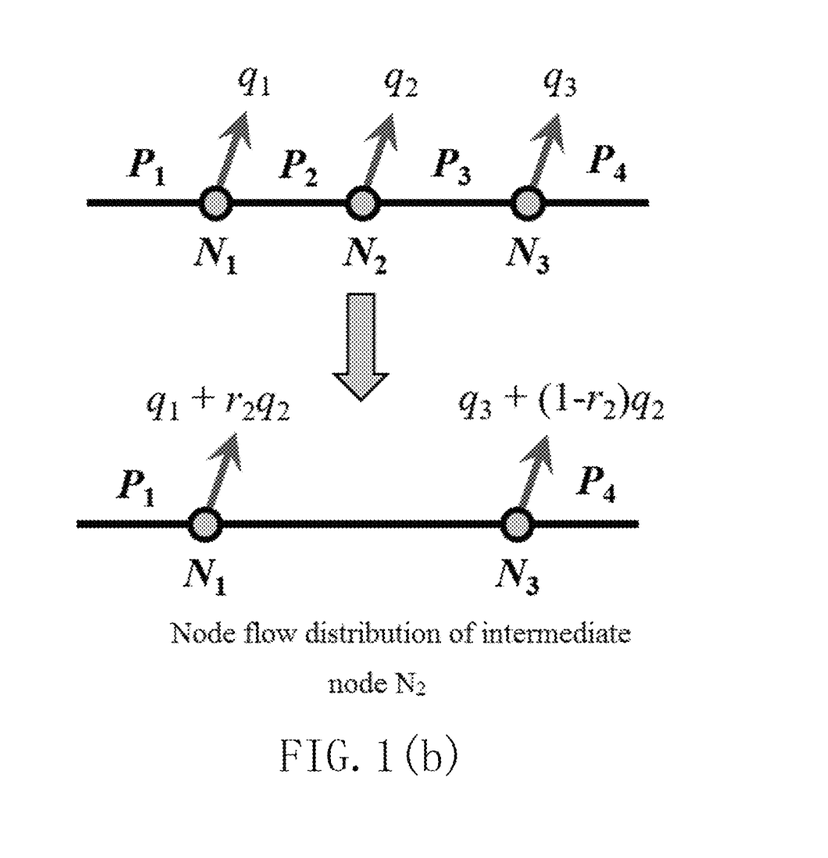

Note that Formula (1) expresses the case where the same-diameter in-series pipeline system has three intermediate nodes and two externally connected pipelines at the connection nodes at both ends. This is a common case of the same-diameter in-series pipeline in the pipeline network model. The situation of having more than three intermediate nodes and a plurality of externally connected pipes (3 or more) at the connection nodes at both ends can be expanded accordingly, and the method of the present invention is still applicable;

(2) For the same-diameter in-series pipeline systems $IDP_i$ in a set IDP, the combination and simplification of the pipeline is to distribute the flow of the intermediate nodes to the nodes at two ends. For example, for the intermediate node $N_2$ in FIG. 1 (b), the flow distribution of the nodes is to distribute the flow of the nodes to the nodes Ni and $N_3$ at both ends to keep the water volume conserved. That is, the water volume of the simplified nodes $N_1$ and $N_3$ are $q_1+r_2q_2$ and $q_3+(1-r_2)q_2$, respectively, wherein $r_2$ represents the distribution coefficient of the water volume of the intermediate node $N_2$. Because the same-diameter in-series pipeline system generally has a plurality of intermediate nodes, it is necessary to determine the simplified error Err generated by the flow distribution of each intermediate node to form a set $Err_i=\{Err_i, Err_2, \ldots, Err_1\}$ (I is the number of the intermediate nodes). The present invention comprehensively considers the minimization in the difference in the propagation process of the transient pressure wave in the system before and after simplification, establishes an optimization objective function to calculate the simplified error generated by the flow distribution of the nodes. Taking the intermediate nodes $N_1, N_2$, and $N_3$ shown in FIG. 1 (a) as an example, the established optimization objective functions are as follows:

$$\text{Min: } Err_1 = w_1^1 \left\{ \begin{array}{l} [(\tilde{\Psi}_0^{N_4} - \tilde{\Psi}_d^{N_4})(T_0^{P_5 \to N_4} + T_0^{P_6 \to N_4})]^2 + \\ \{[(1 - \tilde{\Psi}_0^{N_2})(1 - \tilde{\Psi}_0^{N_1})(1 - \tilde{\Psi}_0^{N_4}) - \\ (1 - \tilde{\Psi}_d^{N_2})(1 - \tilde{\Psi}_d^{N_4})]T_0^{P_1 \to N_4}\}^2 \end{array} \right\} + \quad (2)$$

$$w_1^2 \left\{ \begin{array}{l} (\tilde{\Psi}_0^{N_2} - \tilde{\Psi}_d^{N_2})^2 + \\ \{[(1 - \tilde{\Psi}_0^{N_4})(1 - \tilde{\Psi}_0^{N_1})(1 - \tilde{\Psi}_0^{N_2}) - \\ (1 - \tilde{\Psi}_d^{N_4})(1 - \tilde{\Psi}_d^{N_2})](T_0^{P_5 \to N_4} + T_0^{P_6 \to N_4})\}^2 \end{array} \right\};$$

$$\text{Min: } Err_2 = w_2^1 \{(\tilde{\Psi}_0^{N_1} - \tilde{\Psi}_d^{N_1})^2 + \quad (3)$$
$$[(1 - \tilde{\Psi}_0^{N_3})(1 - \tilde{\Psi}_0^{N_2})(1 - \tilde{\Psi}_0^{N_1}) - (1 - \tilde{\Psi}_d^{N_3})(1 - \tilde{\Psi}_d^{N_1})]^2\} +$$
$$w_2^2 \{(\tilde{\Psi}_0^{N_3} - \tilde{\Psi}_d^{N_3})^2 +$$
$$[(1 - \tilde{\Psi}_0^{N_1})(1 - \tilde{\Psi}_0^{N_2})(1 - \tilde{\Psi}_0^{N_3}) - (1 - \tilde{\Psi}_d^{N_1})(1 - \tilde{\Psi}_d^{N_3})]^2\};$$

$$\text{Min: } Err_3 = w_3^1 \left\{ \begin{array}{l} (\tilde{\Psi}_0^{N_2} - \tilde{\Psi}_d^{N_2})^2 + \\ \{[(1 - \tilde{\Psi}_0^{N_5})(1 - \tilde{\Psi}_0^{N_3})(1 - \tilde{\Psi}_0^{N_2}) - \\ (1 - \tilde{\Psi}_d^{N_5})(1 - \tilde{\Psi}_d^{N_2})](T_0^{P_7 \to N_5} + T_0^{P_8 \to N_5})\}^2 \end{array} \right\} + \quad (4)$$

$$w_3^2 \left\{ \begin{array}{l} [(\tilde{\Psi}_0^{N_5} - \tilde{\Psi}_d^{N_5})(T_0^{P_7 \to N_5} + T_0^{P_8 \to N_5})]^2 + \\ \{[(1 - \tilde{\Psi}_0^{N_2})(1 - \tilde{\Psi}_0^{N_3})(1 - \tilde{\Psi}_0^{N_5}) - \\ (1 - \tilde{\Psi}_d^{N_2})(1 - \tilde{\Psi}_d^{N_5})]T_0^{P_4 \to N_5}\}^2 \end{array} \right\};$$

In the formula, subscripts 0 and d represent the original systems and the system after the water volume of the intermediate nodes is distributed. $w^1$ and $w^2$ are the weight coefficients, which indicate the relative importance of the two simplified in-series pipelines. $\tilde{\Psi}^{N_i}$ is the influence factor of the transient water volume at the node Ni, which indicates the degree of influence of the water volume at a node $N_i$ on a transient flow process, and the value thereof is between 0-100%. $T^{P_j \to N_i}$ is the propagation coefficient of the connecting pipeline $P_j$ at the node Ni. And the mathematical expression thereof is $T^{P_j \to N_i} = (2A_j/a_j)/\Sigma_{m=1}^{M}(A_m/a_m)$, $A=\pi D^2/4$. A is the sectional area of the pipeline. D is the diameter of the pipeline. a is the wave velocity of the pipeline. M is the total number of connection pipelines at the node $N_i$, and m is the m-th connection pipeline at the node $N_i$. The value of the propagation coefficient $T^{P_j \to N_i}$ is between 0~2, which means the change degree of the pressure fluctuation amplitude of the transient pressure wave that propagates along the pipeline $P_j$ to the node $N_i$. for example, in the formula, $T^{P_5 \to N_4}$ represents the multiples of the transient pressure wave propagating along the pipeline $P_5$ to the node $N_4$ relative to an initial amplitude before reaching a node $N_4$, because the pressure wave amplitude of the transient pressure wave that propagates along the pipeline P5 to the node $N_4$ will change. $T_0^{P_6 \to N_4}$ represents the multiples of the transient pressure wave propagating along the pipeline $P_6$ to the node $N_4$ relative to the initial amplitude before reaching the node $N_4$.

For the present invention, the initial steady-state hydraulic state at the node and the properties of the connection pipeline are used to determine the influence factor $\tilde{\Psi}^{N_i}$ of the transient water volume of the node $N_i$, that is, In the formula, $S_{N_i}$ represents the static property at the node $N_i$, which is determined by the initial steady-state hydraulic state at the node and the properties of the connection pipeline, namely, $S_{N_i} = q_0(N_i)/[gH_0^{0.5}(N_i)\Sigma_{m=1}^{M}(A_m/a_m)]$, where $q_0(N_i)$ and $H_0(N_i)$ represent the initial steady-state water volume and pressure at the node $N_i$, respectively, and g is the acceleration of gravity;

The present invention uses the ratio of the length of the in-series pipeline to represent the weight coefficient of the two in-series pipelines, namely:

$$w_1^1 = L(P_1)/[L(P_1)+L(P_2)] \quad (6);$$

$$w_1^2 = L(P_2)/[L(P_1)+L(P_2)] \quad (7);$$

$$w_2^1 = L(P_2)/[L(P_2)+L(P_3)] \quad (8);$$

$$w_2^2 = L(P_3)/[L(P_2)+L(P_3)] \quad (9);$$

$$w_3^1 = L(P_3)/[L(P_3)+L(P_4)] \quad (10);$$

$$w_3^2 = L(P_4)/[L(P_3)+L(P_4)] \quad (11);$$

In the formula, L represents the length of the pipeline.

In the optimization objective function Min: Err, the propagation coefficient is related to the pipeline properties and the initial steady-state hydraulic state of the system before simplification, and is a known parameter. $\tilde{\Psi}_d^{N_i}$ is related to the static properties at the node $N_i$ in the simplified system (that is, after the node flow is distributed) (that is, Formula 5). $S_{N_i}$ is related to the node water volume at the node $N_i$ (here, it refers to the node water volume at the node $N_i$ after the water volume of the intermediate node is distributed). Therefore, the optimization decision variable of the optimization objective function is the water distribution coefficient r of the intermediate node, which can be solved to get the simplified error Err and the corresponding optimization decision variable value r. Specifically, Formulas (2), (3) and (4) can be solved to get the simplified errors $Err_1$, $Err_2$ and $Err_3$ of the intermediate nodes $N_1$, $N_2$ and $N_3$, and the corresponding optimization decision variable values $r_1$, $r_2$ and $r_3$. In order to ensure that the optimization objective function Min: Err is optimized and solved reasonably, the present invention limits the value of the optimization decision variable r to be between 0 and 1.

Formulas (2), (3), and (4) give simplified error solving methods for intermediate nodes at different positions (respectively at the left, middle, and right boundaries) of the same-diameter in-series pipeline system, which can be generalized and applied to the same-diameter in in-series pipeline system with any intermediate node and different externally connected pipelines.

(3) determine the intermediate nodes that can be preferably simplified according to $Err_{min}=\min(Err_i)$. In order to ensure the accuracy of the simplified model, the present invention proposes a simplified error control threshold $Err_{tol}$ to judge whether the combination and operation of the same-diameter in-series pipeline (that is, the water volume of the intermediate node is distributed) is suitably conducted:

If $Err_{min} \leq Err_{tol}$, it can be simplified  (12)

If $Err_{min} > Err_{tol}$, it is not appropriate to simplify  (13)

For the setting of this threshold, the larger Errtol is, the more in-series pipelines are used to distribute the water volume of the intermediate node, and the more transient characteristics of the original system the simplified model will lose. The present invention proposes that the reasonable range of the control threshold $Err_{tol}$ is between 0.01 and 0.03, so as to be suitable for the application requirements of the hydraulic model of the pipeline network at different levels.

If $Err_{min} \leq Err_{tol}$, then continue to execute downward; otherwise, jump to Step (6).

(4) perform a simplified operation on the simplified intermediate nodes to determine the flow of the simplified nodes at two ends and parameters of an equivalent pipeline. The flow of the simplified nodes at both ends can be determined according to the optimization decision variable value r corresponding to $Err_{min}$. For example, the intermediate node $N_2$ is simplified, and the water volume of the nodes $N_1$ and $N_3$ at two ends are $q_1+r_2q_2$ and $q_3+(1-r_2)q_2$, respectively. The parameters of the equivalent pipeline are determined as follows: (1) the pipeline diameter and the wave velocity of the equivalent pipeline are equal to the pipeline diameter and the wave velocity of the in-series pipe, respectively. The wave velocity of the two in-series pipelines is the same; (2) The length of the pipeline is equal to the sum of the length of the two in-series pipelines; (3) the coefficient of resistance of the pipeline is determined according to the principle of hydraulic equivalence, that is, the head loss of the equivalent pipeline after the flow is simplified is the same as the head loss of the in-series pipeline before the flow is simplified.

(5) remove the simplified intermediate nodes in the same-diameter in-series pipeline system IDPi. At this time, if the number of the intermediate nodes in IDPi is 0, it means that the in-series pipelines in the current same-diameter in-series pipeline system have been simplified, then jump to Step (6); otherwise, jump to Step (2) and continue to simplify the current same-diameter in-series pipeline system.

(6) complete the simplification of the current same-diameter in-series pipeline systems, start the simplification of the next group of the same-diameter in-series pipeline systems, and return to Step (2) until all the same-diameter in-series pipeline systems have been simplified, which means a simplified process is ended.

EXAMPLE

Figure 2:
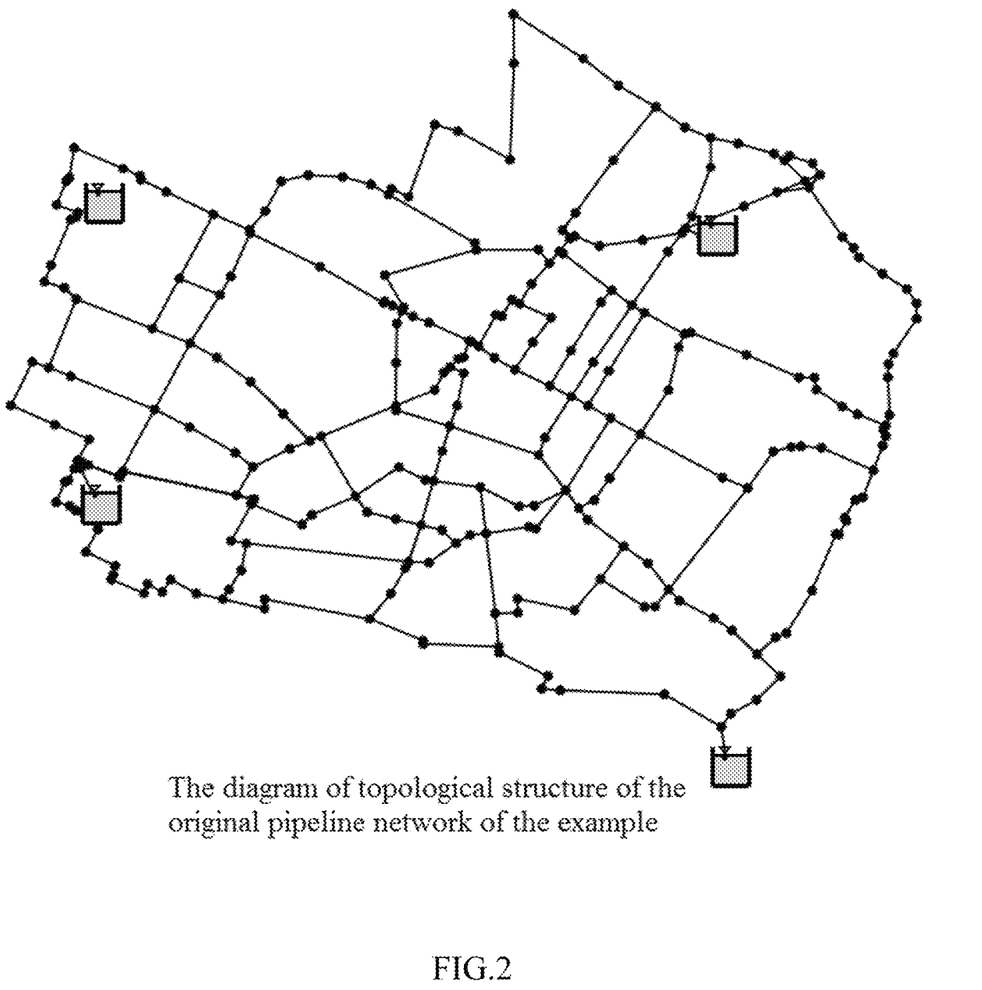
FIG. 2 is a diagram of the topological structure of a water supply pipeline network of an embodiment.

FIG. 2 is a diagram of the topological structure of a water supply pipeline network of this embodiment. The water supply pipeline network has 4 water source pools, 317 pipes, and 268 nodes. In-series pipelines in a pipeline network model are all the same-diameter in-series pipeline type, and the intermediate nodes all have node flow. The method of the present invention is used to simplify the same-diameter in-series pipeline in the pipeline network model (the simplified error control threshold $Err_{tol}$ is set according to the application requirements of the model).

Figure 3:
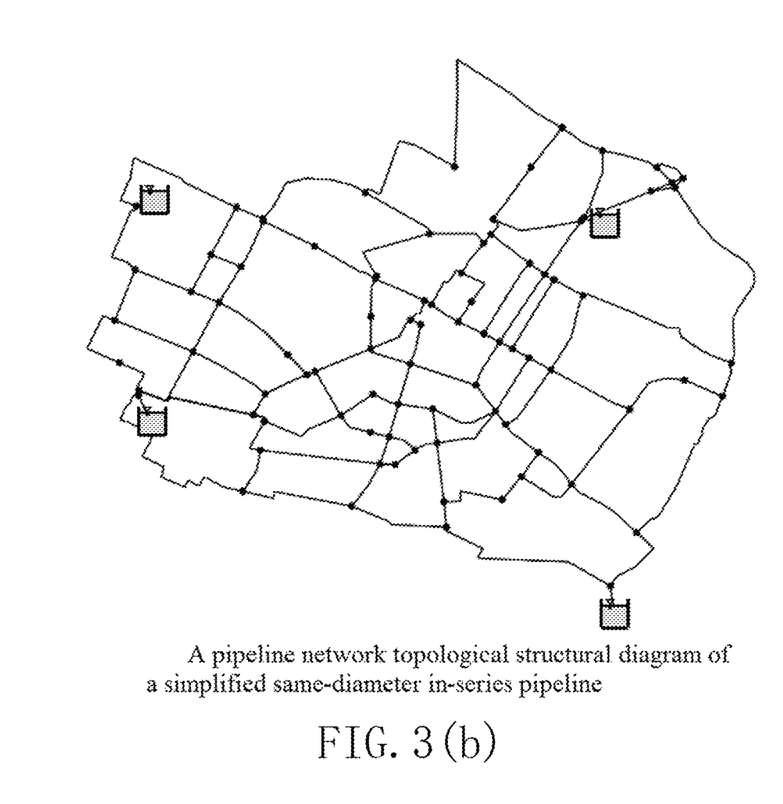
FIG. 3(a)-(b) is a diagram of a topological structure of a pipeline network during and after the simplified implementation of a same-diameter in-series pipeline of an embodiment.
Figure 4A:
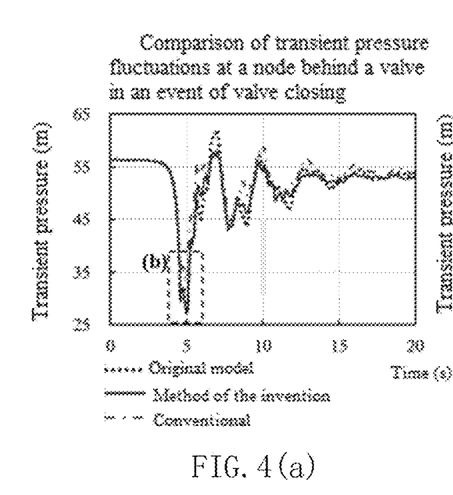
FIG. 4(a)-(d) is a comparison diagram of transient pressure fluctuation at a node obtained by the method of the present invention and the conventional method.
Figure 4B:
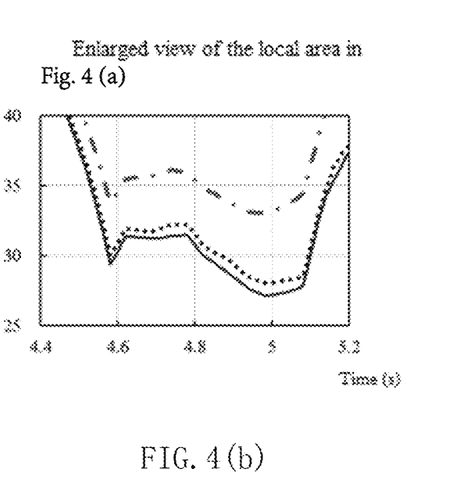
Figure 4C:
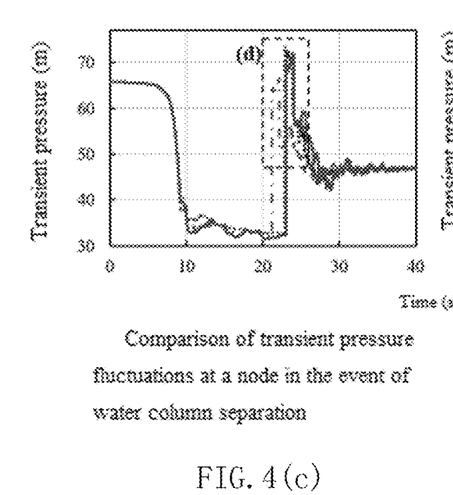
Figure 4D:
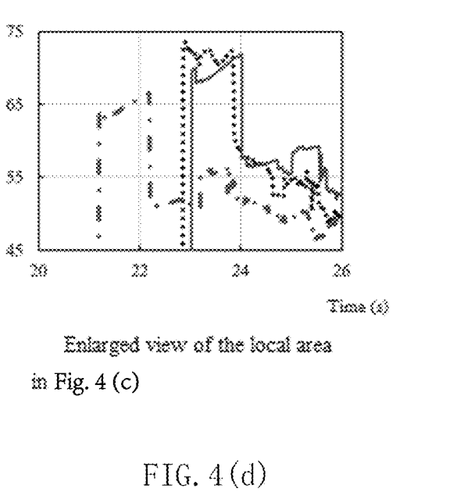

A node flow optimization distribution method for improving the accuracy of transient hydraulic simulation of a water supply in-series pipeline comprises the following steps:

(1) Identify same-diameter in-series pipeline systems (IDP) in a pipeline network model. In this example, a total of 70 groups are identified to form a set IDP={$IDP_1$, $IDP_2$, ..., $IDP_{70}$} of the same-diameter in-series pipeline system. FIG. 3 (a) shows the first group of the same-diameter in-series pipeline systems is mathematically expressed as:

$$IDP_1=\{([1],[2],[3]),(1,2),(3,4),([4],[5],[6]),([7],[8])\} \quad (14);$$

(2) For the same-diameter in-series pipeline system $IDP_1$ in the set IDP, calculate the simplified error generated by the node flow distribution of the intermediate nodes 1 and 2 according to Formulas (2), (3) and (4).

In this example, the intermediate nodes 1 and 2 are the intermediate nodes on the left and right boundaries, respectively, and the simplified errors that are calculated using Formulas (2) and (4) are $Err_1$ and $Err_2$ ($Err_1 < Err_2$), respectively, thereby forming a system IDP1's simplified error set $Err_1=\{Err_1, Err_2\}$.

(3) According to $Err_{min}=\min(Err_i)$, the intermediate node that can be preferably simplified is node 1, that is, $Err_{min}=Err_1$. According to Formulas (12) and (13), it is determined whether the simplified operation is appropriate; if $Err_{min} \leq Err_{tol}$, continue to perform downward; otherwise, jump to Step (10).

(4) Perform a simplified operation on the simplified intermediate node 1. The simplified in-series pipelines [1] and [2] are combined into one equivalent pipeline [12]. The node flow and the parameters of the equivalent pipeline of the simplified nodes 3 and 2 at both ends are determined. The flow of the simplified nodes at both ends can be determined according to the optimization decision variable value $r_1$ corresponding to $Err_{min}$ (that is, $Err_1$), that is, the water volume of the simplified nodes 3 and 2 at two ends are $q_3+r_1q_1$ and $q_2+(1-r_1)q_1$, respectively. The parameters of the equivalent pipeline [12] are determined as follows: (1) The pipeline diameter and the wave velocity of the equivalent pipeline are equal to the pipeline diameter and the wave velocity of the in-series pipeline, respectively; (2) the length of the pipeline is equal to the sum of the length of the two in-series pipelines; (3) the resistance coefficient of the pipeline is determined according to the principle of hydraulic equivalence, that is, the head loss of the equivalent pipeline after the water flow is simplified is the same as the head loss of the in-series pipeline before the water flow is simplified.

(5) Remove the simplified intermediate node 1 in the same-diameter in-series pipeline system $IDP_1$ to obtain $IDP_1=\{[12],[3]),(2),(3,4),([4],[5],[6]),([7],[8])\}$. At this time, the intermediate node of the system $IDP_1$ is node 2, and the number of intermediate nodes is greater than 0, then the current same-diameter in in-series pipeline system continues to be simplified.

(6) For the same-diameter in-series pipeline system $IDP_1$ in the set IDP, the simplified error of the intermediate node 2 is calculated according to Formulas (2), (3) and (4), and the simplified error set $Err_1=\{Err_2\}$ is obtained.

(7) According to $Err_{min}=\min(Err_i)$, the intermediate node that can be preferably simplified is node 2, namely, $Err_{min}=Err_2$. According to Formulas (12) and (13), it is judged whether the simplified operation is appropriately conducted. If $Err_{min} \leq Err_{tol}$, then continue to execute downward; otherwise, jump directly to Step (10).

(8) Perform the simplified operation on the intermediate node 2 that can be simplified. The simplified in-series pipelines [12] and [3] are combined into one equivalent pipeline [123]. The node flow and the parameters of the equivalent pipeline of the simplified nodes 3 and 4 at both ends are determined.

(9) Remove the simplified intermediate node 2 in the same-diameter in-series pipeline system $IDP_1$ to obtain $IDP_1=\{([123]),(\ ),(3, 4),([4],[5],[6]),([7],[8])\}$. At this time, the number of intermediate nodes in the system $IDP_1$ is 0, indicating that the in-series pipelines in the current same-diameter in-series pipeline system have been simplified, and the execution continues downward.

(10) complete the simplification of the current system $IDP_1$, start the simplification of the next group of the same-diameter in-series pipeline system $IDP_2$, and return to Step (2) until all the same-diameter in-series pipeline systems are traversed, indicating the end of the simplification process.

The above steps are taken to achieve the simplification of the same-diameter in-series pipelines in the pipeline network of the example. FIG. 3 (b) shows the simplified result of the simplified error control threshold $Err_{tol}=0.03$; it can be seen from the figure that by setting simplified error control threshold and in the pipeline network model, some simplified nodes that will cause a significant increase in transient hydraulic simulation errors are retained, ensuring the accuracy and reliability of the pipeline network model.

The same transient flow event (i.e., a valve closing event) is triggered in the original model and the simplified model. A transient flow process is simulated and calculated. The simplified pipeline network model used for calculation and analysis results of transient flow is shown in FIG. 4(a)-(d), where FIG. 4 (b) is a partially enlarged diagram of a graph in the dotted box of FIG. 4 (a). FIG. 4 (d) is a partially enlarged diagram of a graph in the dotted box of FIG. 4 (c). FIG. 4(a)-(d) shows the comparison of the calculation results of transient flow of the obtained simplified model and those of the original model obtained by the simplified model obtained by using the method of the present invention and the conventional simplified method (in this example, the conventional simplified method uses the intermediate node flow to share).

It can be clearly seen from FIG. 4(a)-(d) that the simplified method of the present invention is in good agreement with the original model in terms of a peak value and a phase of instantaneous pressure fluctuations. Compared with the conventional simplified method, the method of the present invention has obvious advantages in calculation accuracy. Especially when severe water column separation occurs, as shown in FIGS. 4 (c) and (d). The simplified method of the present invention can still ensure that the calculation results of the transient flow are basically consistent with the original model, while the conventional simplified method will cause the calculation results of the transient flow to be significantly different from the original model in terms of the moment when the water column separation occurs, the volume formed of an air cavity, and the moment and intensity of the water column closing. Therefore, in practical engineering applications, the implementation method of the present invention should be used to simplify the same-diameter in-series pipeline to ensure the accuracy of the calculation of the transient flow, and then provide a scientific basis for the prevention and control of the transient damage of the pipeline network.

Obviously, the described example is only a part of the examples of the present invention, but not all the examples. Based on the examples of the present invention, all other examples obtained by those of the person skilled in the art without creative efforts shall fall within the protection scope of the present invention.

What is claimed is:

1. A method for preventing a transient flow in a water supply pipeline network, comprising following steps:

(1) identify same-diameter in-series pipeline systems (IDP) in a pipeline network model to form a collection IDP={IDP$_1$, IDP$_2$, ..., IDP$_N$} of the same-diameter in-series pipeline systems, the pipeline network model being a geographic information system (GIS) based hydraulic model of the water supply pipeline network, the GIS system having pipeline network topological information and component property information of the water supply pipeline network, and each node of the pipeline network model representing a user of the water supply pipeline network, wherein N is a number of same-diameter in-series pipeline systems in the pipeline network model; the same-diameter in-series pipeline systems are basic objects of simplification of the same-diameter in-series pipelines, for example, one of the same-diameter in-series pipeline systems IDP$_i$ comprises four pipelines P$_1$, P$_2$, P$_3$ and P$_4$ that are connected in series, three nodes N$_1$, N$_2$ and N$_3$ that are connected at middles thereof, and nodes N$_4$ and N$_5$ that are connected at both ends thereof and pipelines P$_5$, P$_6$, P$_7$ and P$_8$ that are connected externally; wherein a node flow rates of nodes N$_1$, N$_2$, N$_3$, N$_4$ and N$_5$ are q$_1$, q$_2$, q$_3$, q$_4$ and q$_5$ in sequence; a mathematical expression of the same-pipeline in-series pipeline systems IDP$_i$ (i=1, ... N) is as follows:

$$\text{IDP}_i = \{(P_1, P_2, P_3, P_4), (N_1, N_2, N_3), (N_4, N_5), (P_5, P_6), (P_7, P_8)\} \quad (1);$$

(2) for the same diameter in-series pipeline systems IDP$_i$ (i=1, 2, 3 ... N) in a set of the IDP, establish an optimization objective function to calculate a simplified error Err generated by the flow distribution of each intermediate node to form the set Err$_i$={Err$_1$, Err$_2$, ..., Err$_I$} (I is the number of intermediate nodes); taking intermediate nodes N$_1$, N$_2$ and N$_3$ as examples, the established optimization objective functions are as follows respectively:

$$\text{Min: } Err_1 = w_1^1 \left\{ \begin{array}{l} [(\Psi_0^{N_4} - \Psi_d^{N_4})(T_0^{P_5 \to N_4} + T_0^{P_6 \to N_4})]^2 + \\ \{[(1-\Psi_0^{N_2})(1-\Psi_0^{N_1})(1-\Psi_0^{N_4}) - \\ (1-\Psi_d^{N_2})(1-\Psi_d^{N_4})]T_0^{P_1 \to N_4}\}^2 \end{array} \right\} + \\ w_1^2 \left\{ \begin{array}{l} (\Psi_0^{N_2} - \Psi_d^{N_2})^2 + \\ \{[(1-\Psi_0^{N_4})(1-\Psi_0^{N_1})(1-\Psi_0^{N_2}) - \\ (1-\Psi_d^{N_4})(1-\Psi_d^{N_2})](T_0^{P_5 \to N_4} + T_0^{P_6 \to N_4})\}^2 \end{array} \right\}; \quad (2)$$

$$\text{Min: } Err_2 = w_2^1 \{(\Psi_0^{N_1} - \Psi_d^{N_1})^2 + \\ [(1-\Psi_0^{N_3})(1-\Psi_0^{N_2})(1-\Psi_0^{N_1}) - (1-\Psi_d^{N_3})(1-\Psi_d^{N_1})]^2\} + \\ w_2^2 \{(\Psi_0^{N_3} - \Psi_d^{N_3})^2 + \\ [(1-\Psi_0^{N_1})(1-\Psi_0^{N_2})(1-\Psi_0^{N_3}) - (1-\Psi_d^{N_1})(1-\Psi_d^{N_3})]^2\}; \quad (3)$$

$$\text{Min: } Err_3 = w_3^1 \left\{ \begin{array}{l} (\Psi_0^{N_2} - \Psi_d^{N_2})^2 + \\ \{[(1-\Psi_0^{N_5})(1-\Psi_0^{N_3})(1-\Psi_0^{N_2}) - \\ (1-\Psi_d^{N_5})(1-\Psi_d^{N_2})](T_0^{P_7 \to N_5} + T_0^{P_8 \to N_5})\}^2 \end{array} \right\} + \\ w_3^2 \left\{ \begin{array}{l} [(\Psi_0^{N_5} - \Psi_d^{N_5})(T_0^{P_7 \to N_5} + T_0^{P_8 \to N_5})]^2 + \\ \{[(1-\Psi_0^{N_2})(1-\Psi_0^{N_3})(1-\Psi_0^{N_5}) - \\ (1-\Psi_d^{N_2})(1-\Psi_d^{N_5})]T_0^{P_4 \to N_5}\}^2 \end{array} \right\}; \quad (4)$$

in formulas above, subscripts 0 and d represent the original same-diameter in-series pipeline system and the same-diameter in-series pipeline system after a water volume of the intermediate nodes is distributed; $w^1$ and $w^2$ are the weight coefficients, which indicate the relative importance of the two simplified in-series pipelines; $\tilde{\Psi}^{N_i}$ is the influence factor of the transient water volume at the node N$_i$, which indicates the degree of influence of the water volume at a node N$_i$ on a transient flow process, and the value thereof is between 0-100%; $T^{P_j \to N_i}$ is the propagation coefficient of the connecting pipeline P$_j$ at the node Ni, and the mathematical expression thereof is $T^{P_j \to N_i} = (2A_j/a_j)/\Sigma_{m=1}^M$ ($A_m/a_m$), $A=\pi D^2/4$, A is the sectional area of the pipeline, D is the diameter of the pipeline, a is the wave velocity of the pipeline, M is the total number of connection pipelines at the node $N_i$, and m is the m-th connection pipeline at a node of $N_i$; the value of the propagation coefficient $T^{P_j \to N_i}$ is between 0~2, which means the change degree of the pressure fluctuation amplitude of the transient pressure wave that propagates along the pipeline $P_j$ to the node $N_i$, specifically, in the formula, $T^{P_5 \to N_4}$ represents the multiples of the transient pressure wave propagating along the pipeline $P_5$ to the node $N_4$ relative to an initial amplitude before reaching a node $N_4$; $T_0^{P_6 \to N_4}$ represents the multiples of the transient pressure wave propagating along the pipeline $P_6$ to the node $N_4$ relative to the initial amplitude before reaching the node $N_4$; the initial steady-state hydraulic state at the node and the properties of the connection pipeline are used to determine the influence factor $\check{\Psi}^{N_i}$ of the transient water volume of the node $N_i$, that is, $$\check{\Psi}^{N_i} = -1.1 \times 10^{-14} S_{N_i}^4 + 8.9 \times 10^{-11} S_{N_i}^3 - 3.1 \times 10^{-7} S_{N_i}^2 + 6.2 \times 10^{-4} S_{N_i}^4 + 3.8 \times 10^{-3} \quad (5);$$

in the formula, $S_{N_i}$ represents the static property at the node $N_i$, which is determined by the initial steady-state hydraulic state at the node and the properties of the connection pipeline, namely, $S_{N_i} = q_0(N_i)/[gH_0^{0.5}(N_i) \Sigma_{m=1}^{M}(A_m/a_m)]$, where $q_0(N_i)$ and $H_0(N_i)$ represent the initial steady-state water volume and pressure at the node $N_i$, respectively, and g is the acceleration of gravity;

the ratio of the length of the in-series pipelines is used to express the weight coefficient of two in-series pipelines, namely:

$$w_1^1 = L(P_1)/[L(P_1)+L(P_2)] \quad (6);$$

$$w_1^2 = L(P_2)/[L(P_1)+L(P_2)] \quad (7);$$

$$w_2^1 = L(P_2)/[L(P_2)+L(P_3)] \quad (8);$$

$$w_2^2 = L(P_3)/[L(P_2)+L(P_3)] \quad (9);$$

$$w_3^1 = L(P_3)/[L(P_3)+L(P_4)] \quad (10);$$

$$w_3^2 = L(P_4)/[L(P_3)+L(P_4)] \quad (11);$$

in the formula, L represents the length of the pipeline;

solving the optimization objective function can obtain the simplified error Err and the corresponding optimization decision variable value r; specifically, solving the formulas (2), (3) and (4) can obtain the simplified errors $Err_1$, $Err_2$ and $Err_3$ of the intermediate nodes $N_1$, $N_2$ and $N_3$, and the corresponding optimization decision variable values $r_1$, $r_2$ and $r_3$, respectively;

(3) according to $Err_{min} = \min(Err_i)$, determine the intermediate nodes that are preferably simplified, in order to ensure the accuracy of the simplified model, according to the control threshold $Err_{tol}$ of the simplified error to judge whether the combining operation of the same-diameter in-series pipelines are suitably conducted:

If $Err_{min} \leq Err_{tol}$, it can be simplified. (12);

If $Err_{min} > Err_{tol}$, it is not appropriate to be simplified. (13);

If $Err_{min} \leq Err_{tol}$, it then continues to execute downward; otherwise, jump to Step (6);

(4) perform a simplified operation on intermediate nodes that can be simplified, to determine the flow of simplified nodes at two ends and the parameters of an equivalent pipeline;

(5) remove the simplified intermediate nodes in the same-diameter in-series pipeline systems $IDP_i$; at this time, if the number of intermediate nodes in the $IDP_i$ is 0, it means that the in-series pipelines in the current same diameter in-series pipeline systems have all been simplified, then jump to Step (6); otherwise, jump to Step (2) and continue to simplify the current same-diameter in-series pipeline systems;

(6) complete the simplification of the current same-diameter in-series pipeline systems, start the simplification of the next group of the same-diameter in-series pipeline systems, and return to Step (2) until all the same-diameter in-series pipeline systems have been simplified, which means a simplified process is ended; and (7) generating indication of prevention of the transient flow to an intelligent management system of the water supply pipeline network such that the intelligent management system controls water supply of the water supply pipeline network based on the indication.

2. The method according to claim 1, wherein in step (2), the value of the optimization decision variable r is between 0 and 1.

3. The method according to claim 1, wherein in Step (3), the control threshold $Err_{tol}$ ranges from 0.01 to 0.03.

4. The method according to claim 1, wherein in Step (4), the flow of the simplified nodes at both ends can be determined according to the value of the optimization decision variable r corresponding to $Err_{min}$, for example, the intermediate node $N_2$ is simplified, and the water volumes of the nodes $N_1$ and $N_3$ at two ends are $q_1+r_2q_2$ and $q_3+(1-r_2)q_2$, respectively; the parameters of the equivalent pipelines are determined as follows: (1) The pipeline diameter and wave velocity are equal to the diameter and wave velocity of the in-series pipelines, respectively; (2) the length of the pipelines is equal to the sum of the length of the two in-series pipelines; (3) the resistance coefficient of the pipelines is determined according to the principle of hydraulic equivalence, that is, the head loss of the equivalent pipelines after water flow is simplified is the same as the head loss of the in-series pipelines before the water flow is simplified.

* * * * *